(12) United States Patent
Von Der Waydbrink et al.

(10) Patent No.: US 8,470,094 B2
(45) Date of Patent: Jun. 25, 2013

(54) APPARATUS FOR CONTINUOUS COATING

(75) Inventors: Hubertus Von Der Waydbrink, Dresden (DE); Siegfried Scheibe, Dresden (DE); Jens Meyer, Dresden (DE); Andrej Wolf, Dresden (DE); Uwe Traeber, Elstra (DE); Michael Hentschel, Dresden (DE)

(73) Assignee: VON ARDENNE Anlagentechnik GmBH, Dresden (DE)

( * ) Notice: Subject to any disclaimer, the term of this patent is extended or adjusted under 35 U.S.C. 154(b) by 0 days.

(21) Appl. No.: 13/293,266

(22) Filed: Nov. 10, 2011

(65) Prior Publication Data

US 2012/0055404 A1    Mar. 8, 2012

Related U.S. Application Data

(63) Continuation of application No. 12/197,638, filed on Aug. 25, 2008, now abandoned.

(30) Foreign Application Priority Data

Aug. 23, 2007 (DE) .................. 10 2007 039 950

(51) Int. Cl.
*C23C 16/54* (2006.01)
(52) U.S. Cl.
USPC ........... 118/718; 118/719; 118/724; 118/729; 118/715; 156/345.37; 427/377; 427/378

(58) Field of Classification Search
USPC ......... 118/700 S, 718–719, 724; 156/345.37; 427/377, 378
See application file for complete search history.

(56) References Cited

U.S. PATENT DOCUMENTS

| 6,013,134 A * | 1/2000 | Chu et al. .................. 118/719 |
| 7,419,566 B2 | 9/2008 | Straemke |
| 2006/0118414 A1* | 6/2006 | Goto et al. .................. 118/719 |
| 2007/0237894 A1* | 10/2007 | Powell .................. 118/719 |

FOREIGN PATENT DOCUMENTS

| DE | 19753684 C1 | 6/1999 |
| DE | 10 2005 037 822 A1 | 2/2007 |
| EP | 1378929 A1 | 1/2004 |

* cited by examiner

*Primary Examiner* — Dah-Wei Yuan
*Assistant Examiner* — Stephen Kitt
(74) *Attorney, Agent, or Firm* — Heslin Rothenberg Farley & Mesiti P.C.

(57) ABSTRACT

Apparatus for continuous coating has a chamber wall which forms a processing chamber, thermal insulation which forms a processing area within the chamber, a transportation device for substrates located in the processing area with a substrate transportation direction of the substrates lying in the lengthwise extension of the apparatus for continuous coating, and heating equipment which heats the substrates, is designed to minimize unwanted coating, in particular of parts of the apparatus, in order to minimize the expense of maintaining and servicing the apparatus A condensation element is positioned in the processing chamber, which extends into the processing area and binds the arising vapor through condensation.

Figure 1:
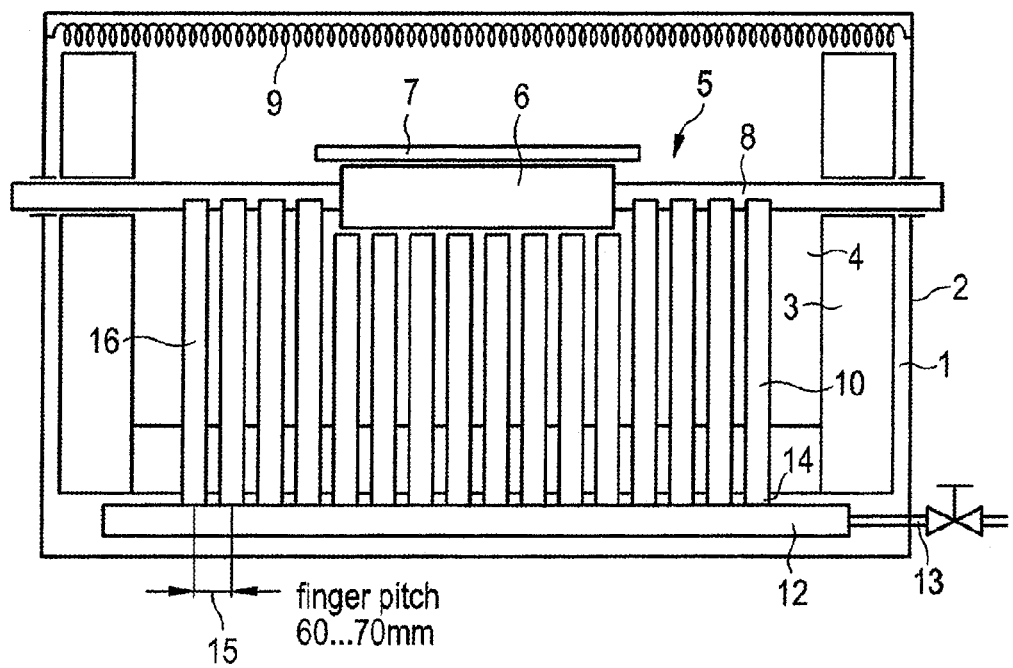

25 Claims, 7 Drawing Sheets finger pitch 60...70mm finger diameter max. 50mm
slit width max. 70mm

APPARATUS FOR CONTINUOUS COATING

CROSS REFERENCE TO RELATED APPLICATIONS

This application is a continuation of U.S. Ser. No. 12/197,638, filed Aug. 25, 2008, and claims priority of German Application No. 10 2007 039 950.4 filed on Aug. 23, 2007, the entire disclosure of which is hereby incorporated by reference herein.

BACKGROUND ART

The invention relates to an apparatus for continuous coating having a chamber wall, which forms a processing chamber, a thermal insulation which forms a processing area within the processing chamber, and a transportation device for substrates located in the processing area with a substrate transportation direction lying in the lengthwise extension of the apparatus for continuous coating. In this, the substrates overlie the side of the transportation device facing the substrate hereinafter referred to as the substrate side. Furthermore, the apparatus for continuous coating includes heating equipment, which heats the substrates.

There are known continuous coating apparatus, which essentially differ from high-vacuum coating apparatus in that they are used at relatively high pressures, i.e. pressures in the range of 1 to 10 mbar and work at high temperatures in the region of over 600° C. The relatively high pressure is preset using a special process gas.

As is known from high-vacuum coating apparatus, there is a transportation device in the processing area, with which it is possible to transport substrates along the length-wise extension of the continuous coating apparatus in one transportation direction. In this, the substrates pass through various processing stations. In such cases these processing stations can be separated from each other, so that separate individual processing areas are formed here.

In the case of traditional high-vacuum apparatus, thermal conduction and convection provide heat escape mechanisms, and convection, through the thermal insulation can be conveniently blocked by using radiation shields. In contrast to traditional high-vacuum coating apparatus, where the high vacuum performs a thermal insulating function, this function is dispensed with in the case of the continuous coating plants described above, which work with relatively high pressures. If, on account of a higher degree of gas pressure, the mechanisms of thermal conduction and convection additionally have an effect, insulation can take place both through radiation shields of a sufficiently high number, which have been set up accordingly and/or through thermal insulating materials. Consequently, thermal insulation is required to be installed on the inner side of the chamber wall, which prevents the escape of heat from the processing chamber or at least makes it more difficult for this to happen. Thermal insulation is in particular necessary at high temperatures, in order to keep the heat loss at a minimum. This thermal insulation therefore encloses the processing area. The high temperature is achieved in the processing area by using special heating equipment.

What is special about such an apparatus for coating is that a significant part of the material vapor generated in the processing area and let in for the coating of the substrate almost fills the entire processing area and a relatively good distribution of the material vapor of the substrate to be coated results inside the processing area. Consequently, vapor particles, which do not reach the substrate, are eliminated inside the processing area and lead to a contamination, for example, of the thermal insulation or even partly on the transportation device. Consequently, relatively short maintenance intervals are necessary.

In high-vacuum coating apparatus, it is common practice to cool parts, which undergo heating through the coating process, for example, the electrodes, by means of cooling elements. Any other use of these cooling elements is not known in the case of such coating apparatus. In continuous coating apparatus, which work at relatively high pressures of the kind cited earlier, the use of cooling elements was not known previously.

The invention is designed to fulfill the task of minimizing unwanted coating, in particular of parts of the apparatus, in order therefore to minimize the expense of maintaining and servicing the apparatus for continuous coating of the type cited in the beginning

BRIEF SUMMARY OF THE INVENTION

In accordance with the invention, this problem is solved in that a condensation element, which extends in the processing area and traps the vapor through condensation, is located in the processing area. With this, the condensation element located in the processing chamber reduces unwanted vapor to a considerable extent through condensation.

With this, the coating vapor will reach the surface of the substrates and all excess vapors, which are formed as a consequence of the high pressure and the high temperature in the rest of the processing area, are captured by the condensation element. With this, there exists the possibility of coating these condensation elements in a targeted manner as dispensable elements, which can then from time to time be removed and replaced or cleaned. These condensation elements can then be located in such a skillful manner in the processing area that easy removal becomes possible, such that the entire installation expense is consequently reduced.

In a version of the invention, the design of the condensation element is envisaged as a cooling element connected with a cooling device. This cooling element thus has a clearly cooler temperature than the remaining elements of the processing area, as a result of which the parasitic processing vapor is precipitated primarily on this cooling element. As a result of the fact that the cooling element is connected to a cooling device, care is taken to ensure that a sufficient temperature difference is constantly maintained vis-à-vis the processing area.

In a version of the invention, there is provision for the cooling element to be located on the side of the transportation device facing away from the substrate side. Under the transportation device, i.e. on the side of the transportation device facing away from the substrate side there is mostly an empty chamber, in which, in this version of the invention, the cooling element can be located.

The cooling element itself can be so designed that it consists of several individual cooling elements, as a result of which the condensation effect can be distributed over a wider surface area.

Water is eminently suitable as a cooling medium as it represents a low-cost and easily available cooling medium. Also, in principle care has to be taken in the case of vacuum usage so that no leakages take place.

Consequently, it is advantageous for the cooling device to be similarly water-cooled and consist of a water-cooled cooling block.

In order to keep the heat input from the processing area in the cooling block itself as low as possible, it is furthermore advantageous to position the cooling block outside the processing area and to allow the cooling elements to extend into the processing area through an opening in the insulation.

Here, it is advantageous in particular to position the cooling block between the thermal insulation and the chamber wall, as then, despite the fact that the outer contour of the chamber wall is not affected, the insulating effect of the thermal insulation can be taken advantage of.

In yet another version of the invention, the individual cooling elements are designed as cooling fingers, which are connected to the cooling block. Thus, the condensation surface area is extended through the form of a cooling finger. Further, the cooling fingers can be more easily set up and also replaced. Finally, the cooling fingers can also be at a distance from each other, so that a current of gas is allowed into the processing area.

In a version of the invention, the cooling fingers consist of a solid material and are connected to the cooling block with thermal conductivity. A solid material which displays characteristics of thermal conductivity is preferred. As a result, heat will be sucked away from the cooling fingers by the cooling block, so that these are suitable for vapor condensation.

This solution is preferred as it fulfills the aim of preventing a cooling medium input in the vacuum chamber. Through this embodiment, it becomes possible to achieve the desired temperature of the element to the largest extent possible and consequently the condensation effect through the type of cooling fingers (material, length/diameter ratio).

In another version, each of the cooling fingers has a hollow chamber, each of which is connected via an intake opening to chambers in the cooling block, which conduct cooling water. Through this arrangement, the cooling water is transported to the cooling fingers and can ensure the conducting of heat out of the cooling fingers from there. Here, it is certainly awkward but necessary to open the water/vacuum sealing with each servicing, something one would rather not do. On the other hand, it is possible to greatly optimize the conduction of heat from the cooling fingers into the cooling block through this arrangement.

Furthermore, it is advantageous for each of the intake openings to be provided with a screw thread, into each of which a cooling finger can be screwed in with a corresponding threaded pipe connection. Through this it becomes possible to uninstall the cooling fingers very rapidly, clean and re-install them or to keep already cleaned cooling fingers handy, which are simply replaced, after which the uninstalled cooling fingers are cleaned and are then available once again to be re-installed.

Furthermore it is useful to position the cooling fingers with a gap between them in a row perpendicular to the transportation direction. This creates a very large surface area of individual cooling elements, which display a high degree of condensation effect. Apart from this, a vapor movement in the direction of the transportation is clearly prevented, as the vapor, which could possibly move in the transportation device, condenses on the condensation elements. It can also be useful not to install condensation elements over the entire width but only locally, in order to minimize parasitic vapor in the area of certain selected surfaces.

A useful type of installation for the cooling fingers consists in positioning the cooling block in the lower area of the processing chamber and arranging the cooling fingers from the lower side of the processing chamber in the direction of the transportation equipment.

Here it is also possible to install a row of cooling fingers on the lower part of the outer sides of the transportation equipment on each side of the substrates, which capture the vapor more effectively, which tends to settle on the roller ends of the transportation rollers in the absence of counter-measures, and leads to an increase in the diameter of the rollers at the ends, as a result of which problems arise, the substrates do not overlie the full surface any longer, from which transportation problems could arise. Here, the effect will be better as opposed to a row of cooling fingers installed perpendicularly to the transportation direction, only under the substrate.

As an alternative to this, it is also possible for the cooling fingers to stretch from the upper side of the processing chamber in the direction of the transportation equipment.

But both solutions can also be employed under certain other circumstances, for example, for the realization of the maximum possible condensation, viz. that the cooling fingers are arranged above and below the transportation equipment. In such a case, the length of the cooling fingers can be such that they stretch to the transportation equipment without touching it. With this, the complete cross-sectional area so to speak of the processing chamber under the transportation equipment will be blocked to vapor, which tries to cross it. Then the entire parasitic vapor would not be able to enter the area under the substrate.

It has been shown that coating behavior can also be influenced by the condensation elements. Thus, it is possible to set a profile of the coating rate perpendicular to the transportation direction, in that the geometric form of the cooling fingers and/or the distance between them changes from the middle of the transportation equipment in the direction of the outer sides of the transportation equipment.

Here it is possible that the changes are symmetrically arranged with respect to both sides. This way, it can occasionally be ensured that a particularly high or particularly low coating rate occurs in the middle, something which can take place following the special features of the coating apparatus. Such an occurrence can be compensated by such an arrangement. But also specifically differing coating rates, for example for the purposes of deliberately achieving different thicknesses of the layers, can be achieved through this.

A certain version here envisages that the distances from the middle of the transportation equipment to its outer sides display constant changes, whereby the distances become either larger or smaller.

An alternative or additional possibility of influencing the coating rate envisages that the cross-sectional areas of the cooling fingers display a constant change from the middle of the transportation equipment to its outer sides.

Depending on the type of influence the cross-sectional areas can become larger or smaller. It is useful to design the cooling fingers in such a manner that they have a circular cross-section, whereby the diameter is smaller by one size in proportion to the length of the cooling fingers. Through this, the cooling fingers themselves can be manufactured in a cost effective manner. Apart from this, this solution is to be preferred in cases when the finger is to be directly cooled with water. As material for the manufacture of the cooling fingers, stainless steel, normal steel, aluminum or any other substance that approximate the thermal coefficient as the substances named above, are suitable. Depending on the desired temperature distribution along the cooling fingers, the most differing substances are particularly suitable, highly thermal conductive substances such as copper, aluminum and Al-coatings for lower finger temperatures, medium thermal conductive substances such as steel for higher finger temperatures, as long as they are sufficiently low for the condensation to take place.

For the easy removal of the condensation on the surface of the cooling fingers, it can be furthermore preferable for each of the cooling fingers to be provided with a removable covering, which covers the surface of the cooling fingers at least partially. A pre-condition for a complete covering is that it enables a minimal degree of condensation, looked at from the perspective of the temperature level, since the transfer of heat from the covering to the cooling finger is insufficient in any case. The coverings with their surfaces would serve the purpose of separating functionality, whereby the cooling fingers themselves serve to suck heat out of the coverings, without themselves coming into contact with the condensation. In this way, the expense of servicing and maintenance is lowered even further.

BRIEF DESCRIPTION OF THE DRAWING FIGURES

Figure 2:
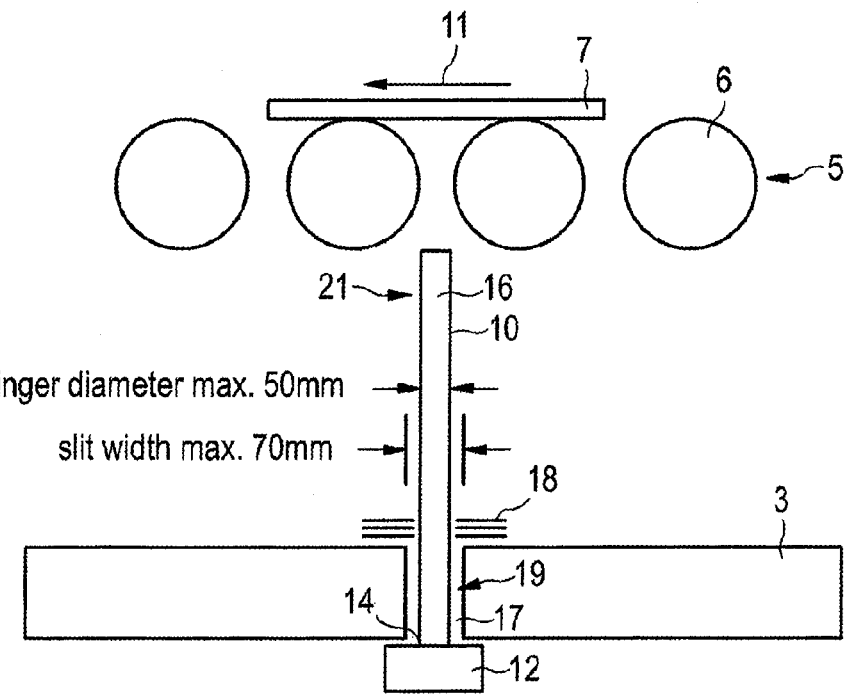
Figure 3:
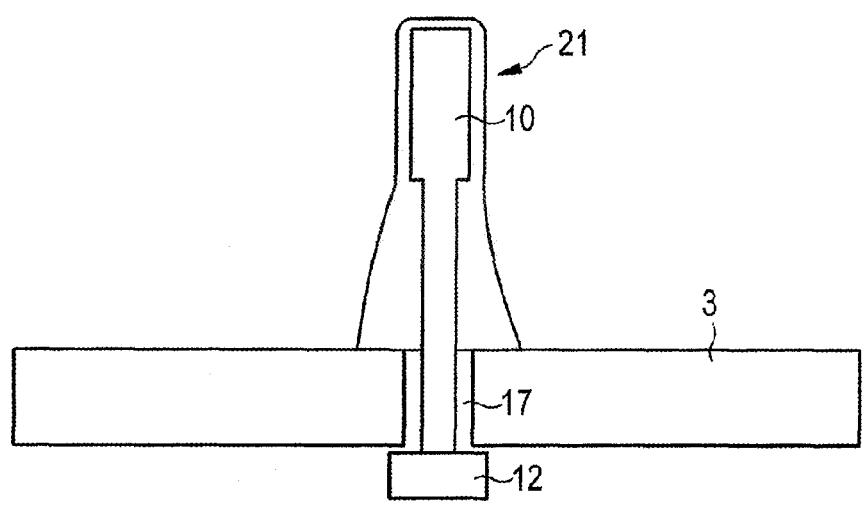
Figure 4:
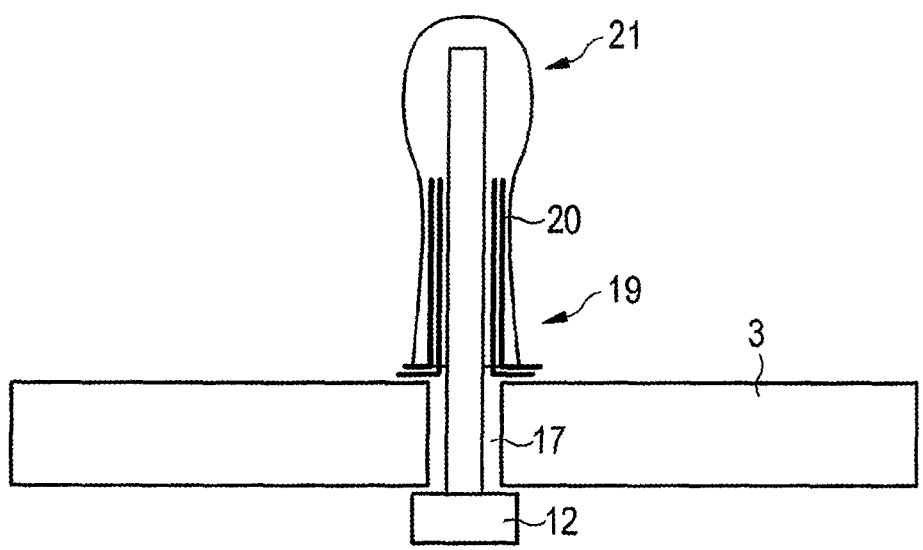
Figure 5:
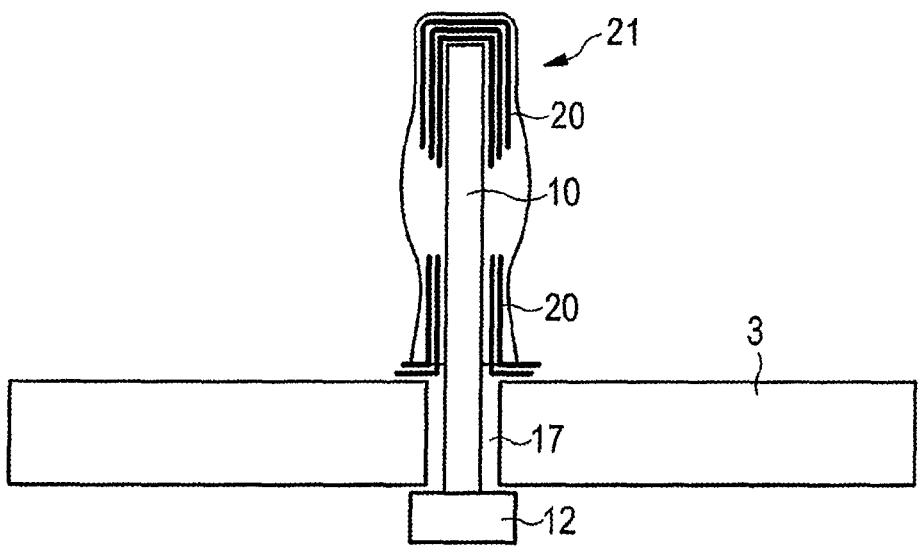
Figure 6:
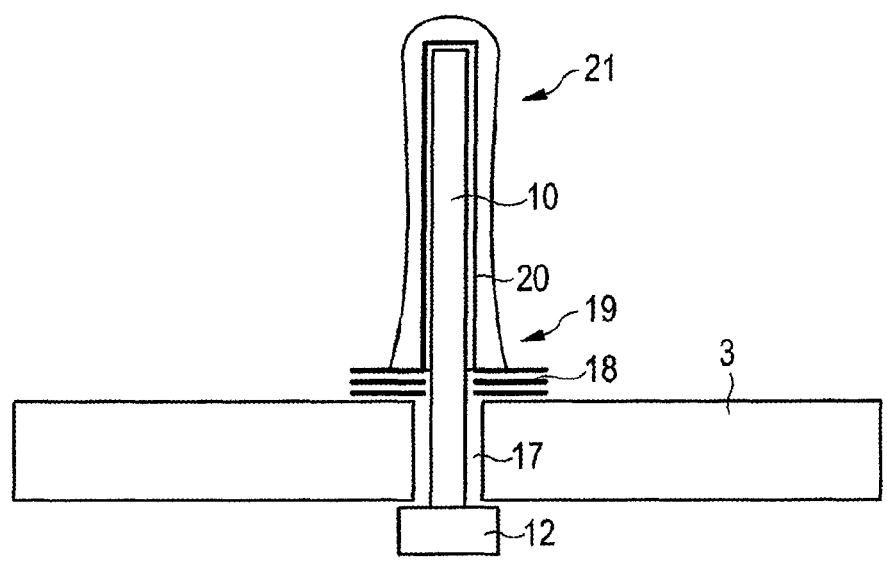
Figure 7:
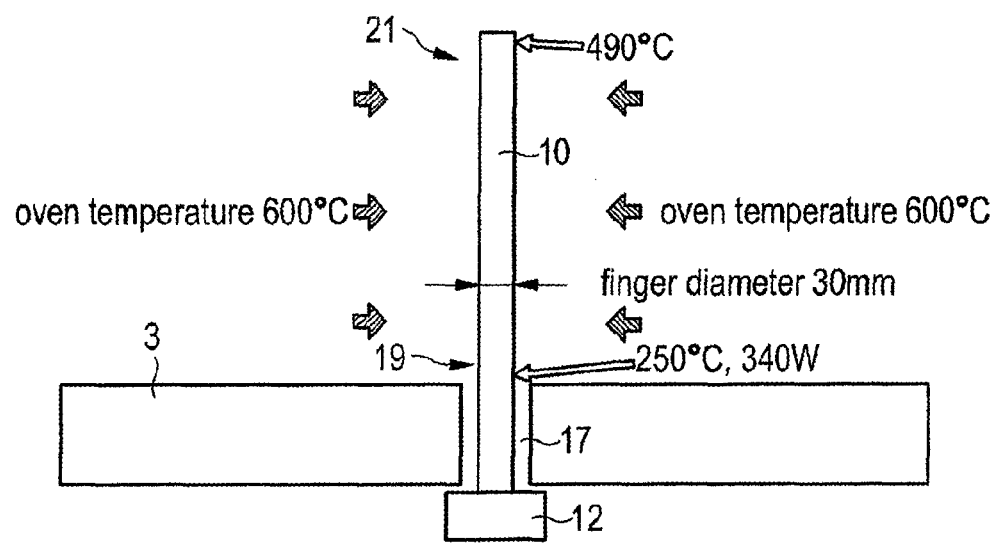
Figure 8:
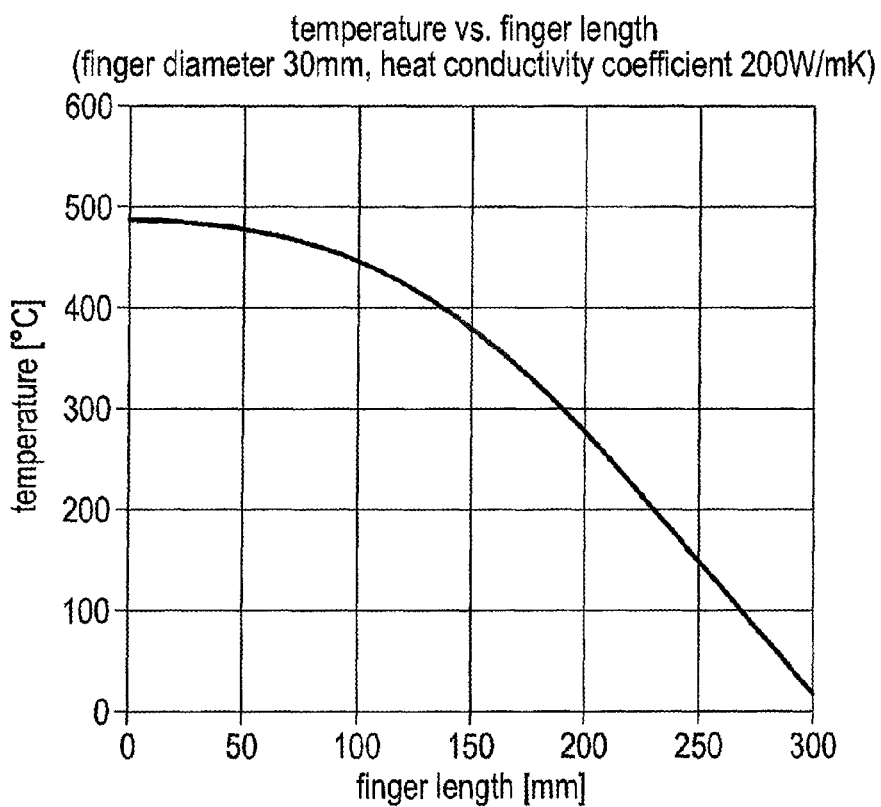
Figure 9:
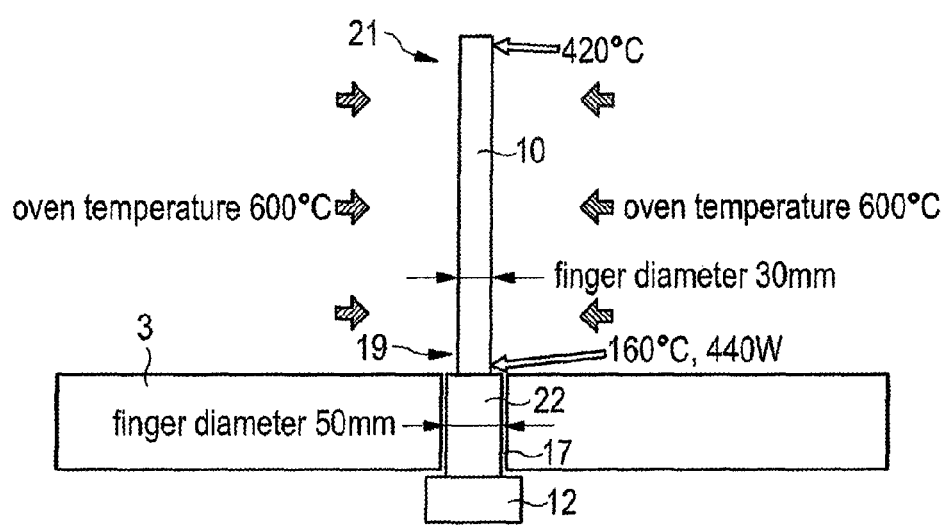
Figure 10:
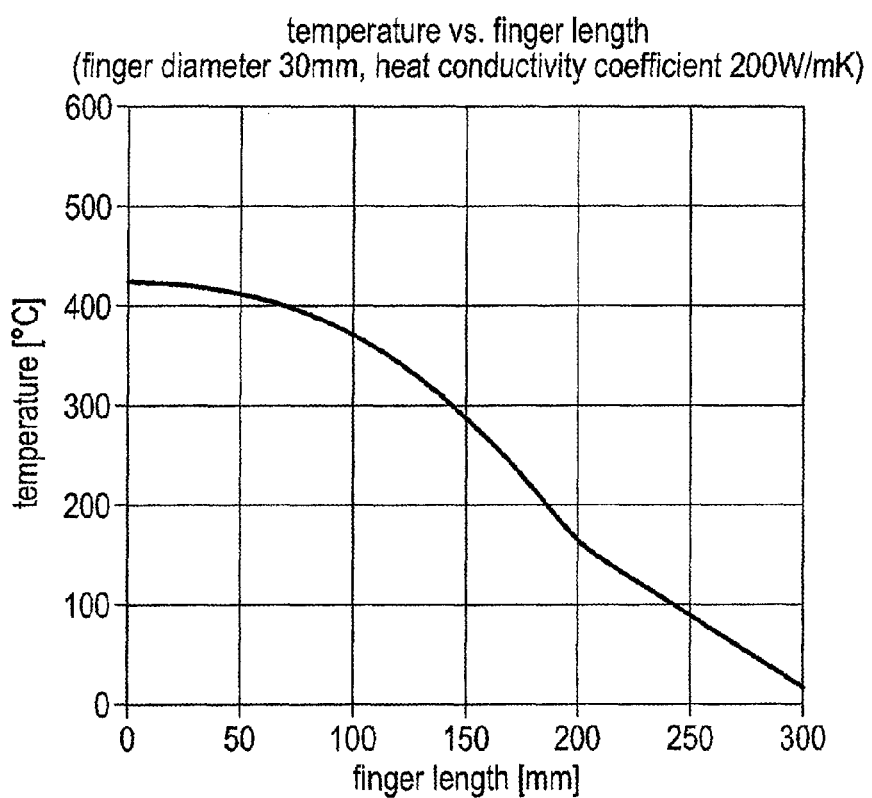
Figure 11:
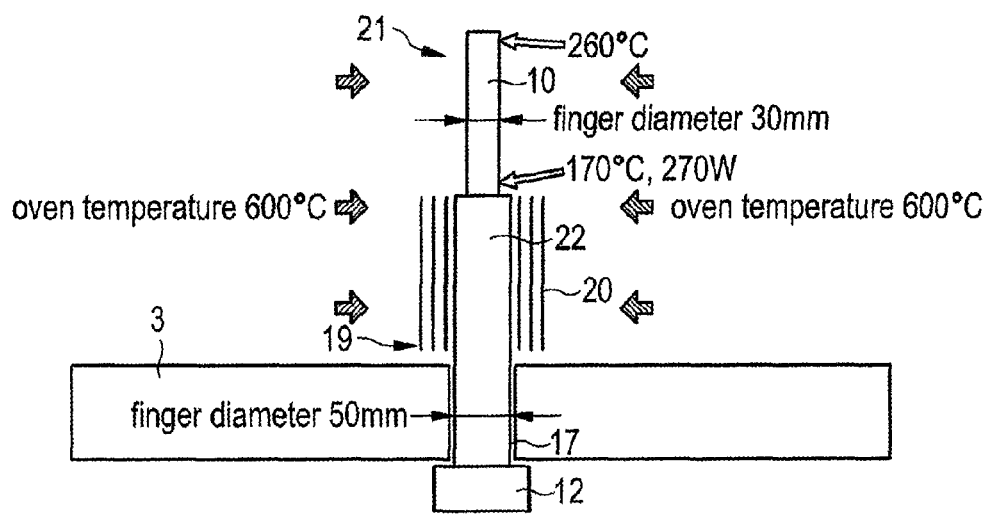
Figure 12:
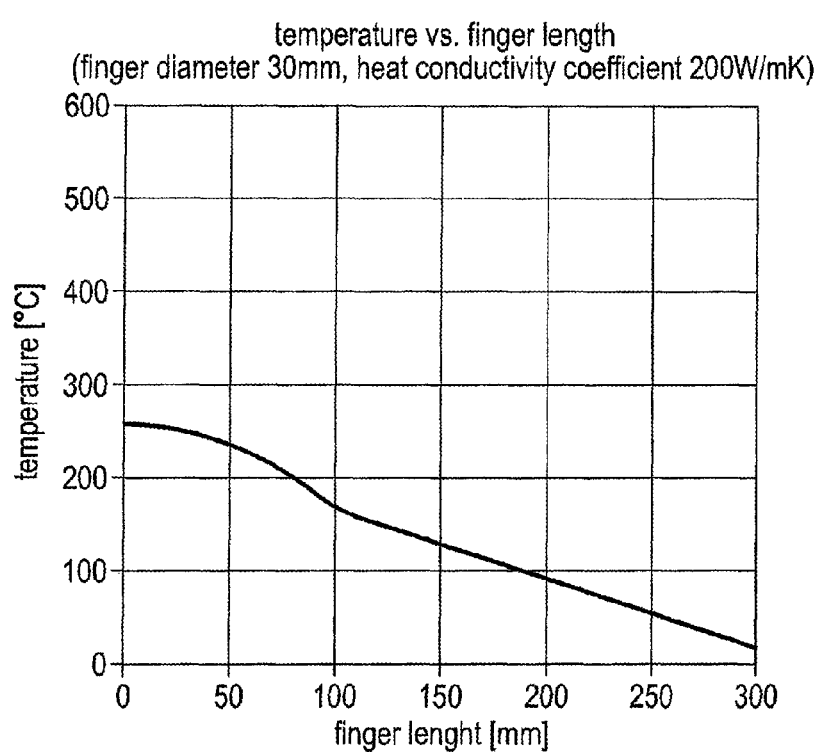

The invention will now be explained in more detail on the basis of exemplary versions. In the accompanying drawings, FIG. 1 shows a cross-section of an apparatus for continuous coating in accordance with the invention with a row of cooling fingers perpendicular to the transportation direction, FIG. 2 shows a partial cross-section of the apparatus for continuous coating in accordance with the invention of FIG. 1, length-wise to the transportation direction, FIG. 3 shows a design for cooling fingers with a cylindrical thickening at the top, FIG. 4 shows a design for the cooling fingers with a partial covering in the lower region of the cooling fingers, FIG. 5 shows a design for the cooling fingers with a partial covering in the lower region and at the top of the cooling fingers, FIG. 6 shows a design for the cooling fingers with a complete covering of the cooling fingers and shield of the opening in the insulation, FIG. 7 shows the temperature behavior at a cooling finger with a slender intake, FIG. 8 shows a diagram of the temperature behavior along the finger length of the design in accordance with FIG. 7, FIG. 9 shows the temperature behavior at a cooling finger with an increased intake, FIG. 10 shows a diagram of the temperature behavior at a cooling finger in the version in accordance with FIG. 9, FIG. 11 shows the temperature behavior at a cooling finger with an increased intake and covering in the lower region, FIG. 12 shows a diagram of the temperature behavior along the length of the cooling finger in a version of the finger in accordance with FIG. 11.

DETAILED DESCRIPTION

As represented in FIG. 1, the apparatus for continuous coating includes a chamber wall 2 forming a processing chamber 1. Thermal insulation 3, which forms a processing area 4, is located in this processing chamber 1. A transportation device 5 is located in the processing area 4. This transportation device 5 has transportation rollers 6 for the transportation of the substrates 7 as well as drive shafts 8 for powering the transportation rollers 6. The substrates 7 are coated at a temperature in the range of 500° C. up to typically approx. 600° C. However, the temperature can also be higher than this. There is heating equipment 9 for heating the substrates 7.

Furthermore, the coating of the substrates 7 takes place under a pressure range of 1 to 10 mbar, as a result of which vapor of the material to be coated can spread well in the processing area 4. There are cooling fingers 10 in order to prevent this vapor from collecting on the transportation device 5 or on the inner walls of the thermal insulation 3. These cooling fingers 10 are arranged in a row perpendicular to the transportation direction 11, as can be seen in FIG. 2. The arrangement of the cooling fingers is however not limited only to the version represented here.

In fact, these can also be arranged in two rows, one to the left of the substrate and one to the right of it.

A cooling block 12 is positioned between the chamber wall 2 and the thermal insulation 3. This cooling block 12 is connected by a cooling water pipe 13 to a cooling water source, which is not represented here in more detail. The cooling fingers 10 are screwed into intake bores 14 in this cooling block 12.

The cooling fingers 10 are at a distance 15 from each other, so that they cover almost the entire cross-sectional surface of the processing area 4. The length of the cooling fingers 10 is so designed that they reach into the area of the transportation device 5.

The cooling fingers 10 consist of tubes, so that they form a hollow space 16 inside them, which is connected to the cooling water of the cooling block 12. Through this arrangement, it becomes possible to lower the temperature of the cooling fingers 10 to a level that is clearly lower than the temperature prevailing in the processing area 4.

If the cooling fingers 10 are manufactured out a substance with good thermal conductivity, it is also possible to manufacture these out of a solid substance, so that they are not connected inside with the cooling water, but only the conduction of heat takes place inside the cooling fingers. In this case as well, the cooling fingers 10 display a lower temperature than that prevailing in the processing area 4.

As a result of this temperature difference, processing vapor, which would otherwise undesirably enter the processing area and is not used for the coating of the substrates 7, condenses on the surface of the cooling fingers 10. These cooling fingers 10 are also coated through this action. As they can be removed relatively easily from the processing area 4 and can be cleaned, it is possible to prevent the parasitic coating of the thermal insulation 3 or the transportation device 5 or other component parts, which are not supposed to be coated. In this, these cooling fingers 10 act as a "vapor trap" so to speak.

It is also possible to vary the cross-sectional surface, in particular through varying the diameter of the cooling fingers 10 and/or the distance between them along the length of the cooling block, in order to influence, as a result of this, the coating rate in a targeted manner and be able, as a further result, to set a profile of the coating rate perpendicular to the transportation direction.

As represented in FIG. 2, the cooling fingers 10 are led into the processing area 4 through an opening 17 in the form of a slit in the thermal insulation 3. There is a shield 18, which covers the slit-shaped opening 17 on its upper side in order to prevent a parasitic coating of the side walls of the slit-shaped opening 17.

As represented in FIG. 3, the cooling fingers 10 exhibit not only a simple cylindrical form, but also a cylindrical widening on their upper side. With this, it becomes possible to influence the direction of the temperature profile of the cooling fingers in a targeted manner, so that it is only relatively far in the direction of the cooling block 12 that they exhibit a clearly lower temperature. Through this it is possible to influence the coating of the cooling fingers 10.

As represented in FIG. 4, the cooling fingers in the lower region 19 can be provided with a covering 20. As a result of this covering 20, it is possible for example to set an almost homogenous temperature profile along the entire length of the cooling fingers. The arrangement of the covering 20 in FIG. 5 shows a similar effect as well. Here, the covering 20 is not only arranged in the lower region 19 of the cooling fingers 10, but also on the upper side 21 of the cooling fingers.

The covering 20 in FIGS. 4, 5 and also 6 takes over the function of the shield 18 over the slit-shaped opening 17 at the same time. In this case, in FIG. 6, a complete covering 20 of the cooling fingers 10 is represented. As a result of such a covering, not only can the temperature profile of the cooling fingers 10 be influenced, it also becomes far easier to clean the cooling fingers. If the covering 20 is removed from the processing area 4 along with the cooling fingers 10, only the covering 20 then needs to be removed from the cooling finger and a new covering to be slipped on so that the cooling finger or fingers 10 are ready to be inserted into the processing area 20 once again.

It is however also possible to influence deposition in such a manner that locations preferred for deposition can be selected in a targeted manner. In this sense, the represented shield can also be conversely understood to be locations with a higher degree of deposition. With this, it could be illustrated that the use of shields (apart from the advantages already cited above) can be expedient when particular condensation sites are desired and the finger is not meant to be immediately changed in order to achieve this. When the finger e.g. is too high and the condensate grows so high that it touches the transportation system, one could cover the upper end of the finger with radiation shields to such an extent that negligible condensation takes place there.

FIG. 7 shows the temperature behavior of a cooling finger with a slim intake, i.e. a continuous cylindrical form with a constant diameter. While, in this example, at a processing temperature of 600° C., a temperature of 490° C. still prevails at the upper region 21 of the cooling fingers 10, a temperature of only 250° C. can already be measured in the lower region 19 through the action of thermal conductivity in the case of solid substance version of the cooling fingers 10, or in that heat is conducted by means of cooling water. The temperature behavior along the length of the finger is shown by the graphic representation in FIG. 8. Here, on the right-hand side, the entry of the cooling finger 10 in the region of the thermal insulation 3 in the slit-shaped opening 17 can be seen.

The version of the cooling finger with an increased intake 22 in the lower region 19 of the cooling fingers 10, shown in FIG. 9, displays a different temperature behavior. Here, an increased intake 22 means that cooling fingers with a larger diameter are being used in this case. As represented in FIG. 9 and also in FIG. 10, an even clearer lowering of the temperature in the lower region 19 is achieved by means of such an increased intake 22.

As a result of an intake, which has been further increased 22, as is represented in FIG. 11, a more extreme cooling of the cooling FIG. 9 is already achieved on the upper side. This is supported by the fact that the increased intake 22 in FIG. 11 is additionally provided with a covering 20.

As is depicted in FIG. 12, here clearly lower temperatures on the upper side 21 of the cooling fingers 10 are achieved, in this example, 260° C.

The invention claimed is:

1. Apparatus for continuous coating having a chamber wall, which forms a processing chamber, thermal insulation, which forms a processing area within said chamber, a transportation device for substrates located in the processing area with a substrate transportation direction of the substrates lying along a lengthwise extension of the apparatus for continuous coating, wherein the substrates overlie a substrate side of the transportation device and further including heating equipment which heats the substrate, and wherein a condensation element extending into the processing area, and trapping vapor by condensation, is located in the processing area, and wherein the condensation element comprises a cooling element connected with a cooling device, and the cooling device comprises a water-cooled cooling block.

2. Apparatus for continuous coating in accordance with claim 1, wherein the cooling element is located on an opposite side of the transportation device from the substrate side.

3. Apparatus for continuous coating in accordance with claim 1, wherein the cooling element comprises several individual cooling elements.

4. Apparatus for continuous coating in accordance with claim 1, wherein the cooling block is located outside the processing area and the cooling element extends into the processing area through an opening in the insulation.

5. Apparatus for continuous coating in accordance with claim 4, wherein the cooling block is positioned between the thermal insulation and the chamber wall.

6. Apparatus for continuous coating in accordance with claim 3, wherein the individual cooling elements comprise cooling fingers which are connected to the cooling block.

7. Apparatus for continuous coating in accordance with claim 6, wherein the cooling fingers are made of solid substance and are connected with the cooling block by thermal conductivity.

8. Apparatus for continuous coating in accordance with claim 6, wherein each of the cooling fingers includes a hollow space connected via an intake opening in the cooling block with chambers in the cooling block for conducting cooling water.

9. Apparatus for continuous coating in accordance with claim 8, wherein the intake openings are each provided with a screw thread, into which a cooling finger can be screwed with a corresponding threaded pipe connection.

10. Apparatus for continuous coating in accordance with claim 6, wherein the cooling fingers are arranged at a distance from each other in a row perpendicular to the transportation direction.

11. Apparatus for continuous coating in accordance with claim 10, wherein the cooling fingers extend from a lower side of the processing area in the direction of the transportation device.

12. Apparatus for continuous coating in accordance with claim 10, wherein the cooling fingers extend from an upper side of the processing area in the direction of the transportation device.

13. Apparatus for continuous coating in accordance with claim 10, wherein the cooling fingers are arranged above and below the transportation device.

14. Apparatus for continuous coating in accordance with claim 11, wherein the cooling fingers extend to the transportation device, without touching the transportation device.

15. Apparatus for continuous coating in accordance with claim 10, wherein a geometric form of the cooling fingers and/or distance between the fingers changes from a middle of the transportation device in the direction of the outer sides of the transportation device.

16. Apparatus for continuous coating in accordance with claim 15, wherein the changes are symmetrical in form with respect to both sides.

17. Apparatus for continuous coating in accordance with claim 15, wherein the distances between the fingers from the middle of the transportation device to the outer sides of the transportation device differ.

18. Apparatus for continuous coating in accordance with claim 17, wherein the distances become larger.

19. Apparatus for continuous coating in accordance with claim 17, wherein the distances become smaller.

20. Apparatus for continuous coating in accordance with claim 15, wherein cross-sectional areas of the cooling fingers differ from the middle of the transportation device to the outer sides of the transportation device.

21. Apparatus for continuous coating in accordance with claim 20, wherein the cross-sectional areas become larger.

22. Apparatus for continuous coating in accordance with claim 20, wherein the cross-sectional areas become smaller.

23. Apparatus for continuous coating in accordance with claim 6, wherein the cooling fingers exhibit a circular cross-section with a diameter, and the diameter is a size smaller in proportion to a length of the cooling fingers.

24. Apparatus for continuous coating in accordance with claim 6, wherein the cooling fingers are made of stainless steel, normal steel, aluminum or a substance with similar thermal coefficient as stainless steel, normal steel or aluminum.

25. Apparatus for continuous coating in accordance with claim 6, wherein each of the cooling fingers is provided with a removable covering, and each covering covers a surface of a corresponding cooling finger at least partially.

* * * * *